United States Patent
Duncan et al.

(10) Patent No.: US 12,453,059 B2
(45) Date of Patent: Oct. 21, 2025

(54) SYSTEM AND METHOD FOR PER-TENANT REDUNDANT THERMAL MANAGEMENT USING LIQUID COOLING

(71) Applicant: Dell Products L.P., Round Rock, TX (US)

(72) Inventors: Tyler Baxter Duncan, Austin, TX (US); Anthony Middleton, Cedar Park, TX (US); Ty Robert Schmitt, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 320 days.

(21) Appl. No.: 17/971,164

(22) Filed: Oct. 21, 2022

(65) Prior Publication Data

US 2024/0138119 A1   Apr. 25, 2024
US 2024/0237298 A9   Jul. 11, 2024

(51) Int. Cl.
   *H05K 7/20*   (2006.01)

(52) U.S. Cl.
   CPC ..... *H05K 7/20763* (2013.01); *H05K 7/20272* (2013.01)

(58) Field of Classification Search
   CPC ........... H05K 7/20763; H05K 7/20272; H05K 7/20781
   See application file for complete search history.

(56) References Cited

U.S. PATENT DOCUMENTS

| | | | | |
|---|---|---|---|---|
| 8,184,436 B2 * | 5/2012 | Campbell | ............... | H05K 7/203 361/701 |
| 2005/0122685 A1 * | 6/2005 | Chu | ..................... | H05K 7/2079 361/689 |
| 2011/0056675 A1 * | 3/2011 | Barringer | ............. | H05K 7/2079 165/80.4 |
| 2015/0356431 A1 | 12/2015 | Saxena et al. | | |
| 2016/0215526 A1 * | 7/2016 | AbuGhazaleh | ...... | H05K 5/0221 |
| 2016/0269328 A1 | 9/2016 | Pola | | |
| 2018/0324976 A1 * | 11/2018 | Gao | .................... | H05K 7/20836 |
| 2019/0243430 A1 * | 8/2019 | Slaby | ...................... | G06F 1/206 |
| 2022/0095491 A1 * | 3/2022 | Gao | .................... | H05K 7/20281 |
| 2022/0240421 A1 * | 7/2022 | Zhang | ....................... | G06F 1/20 |
| 2022/0338389 A1 * | 10/2022 | Zuo | .................... | H05K 7/20836 |
| 2022/0361376 A1 * | 11/2022 | Gao | .................... | H05K 7/20818 |
| 2023/0089909 A1 * | 3/2023 | Gao | .................... | H05K 7/20781 361/679.53 |
| 2024/0138106 A1 * | 4/2024 | Duncan | ............. | H05K 7/20272 |

* cited by examiner

*Primary Examiner* — Stephen S Sul
(74) *Attorney, Agent, or Firm* — Chamberlain, Hrdlicka, White, Williams & Aughtry; Aly Z. Dossa

(57) ABSTRACT

A system including a first section and a second section. The first section includes a first plurality of chassis associated with a first tenant and the second section comprising a second plurality of chassis associated with a second tenant. The system further includes a first pair of cooling units and a first pair of manifolds fluidly connecting the first plurality of chassis to the first pair of cooling units. The system further includes a second pair of cooling units and a second pair of manifolds fluidly connecting the first plurality of chassis to the first pair of cooling units.

3 Claims, 15 Drawing Sheets

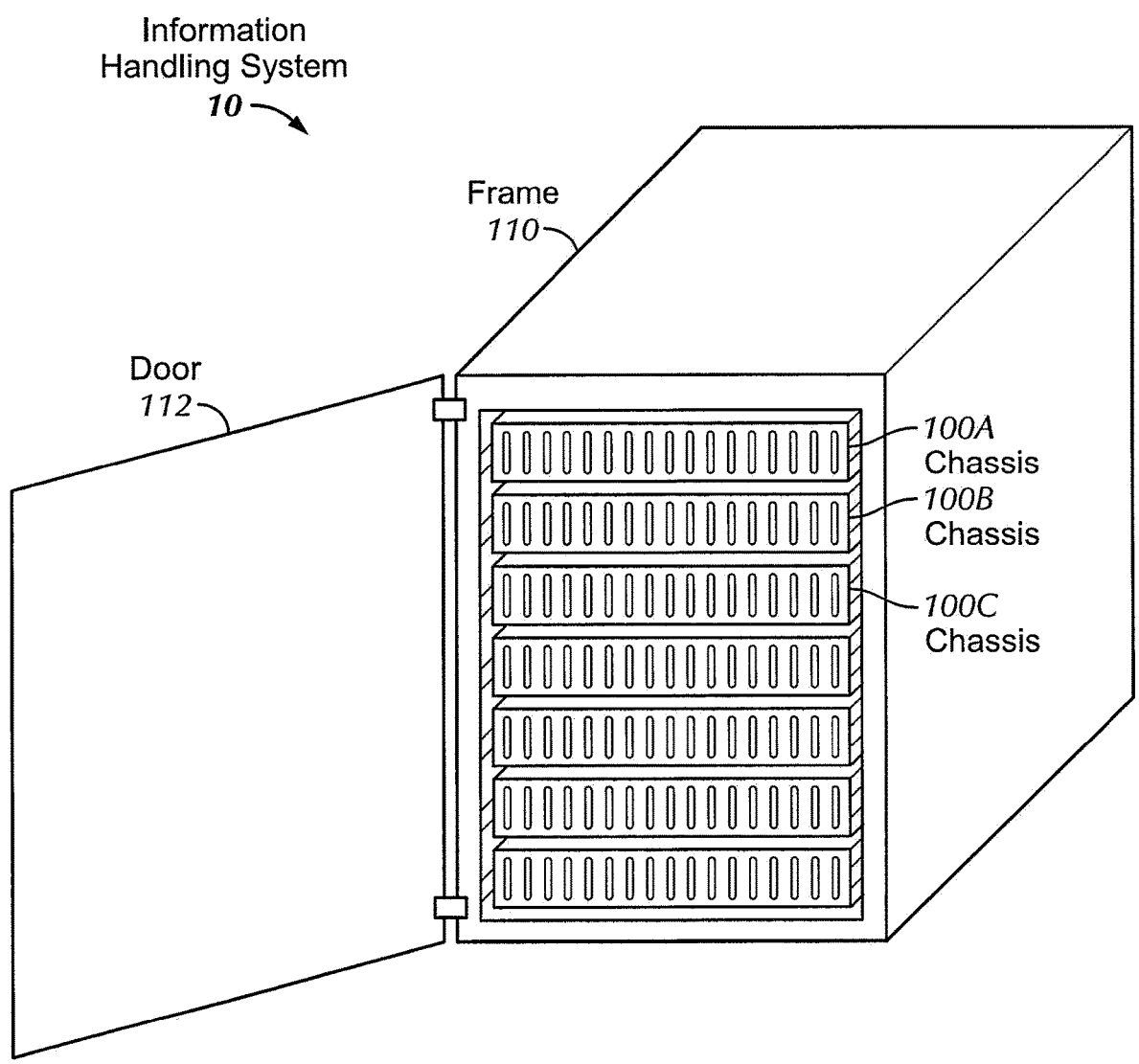
FIG. 1.1

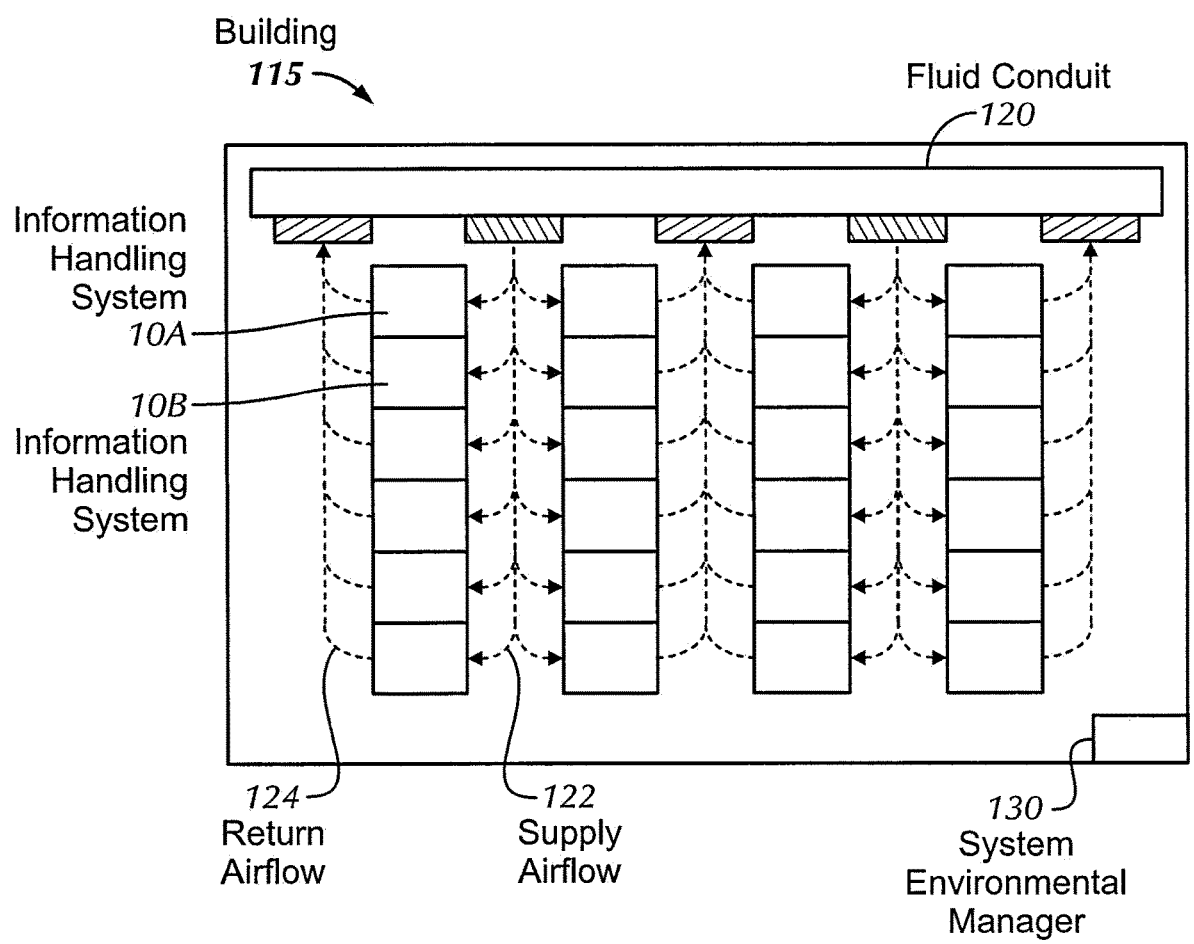
FIG. 1.2

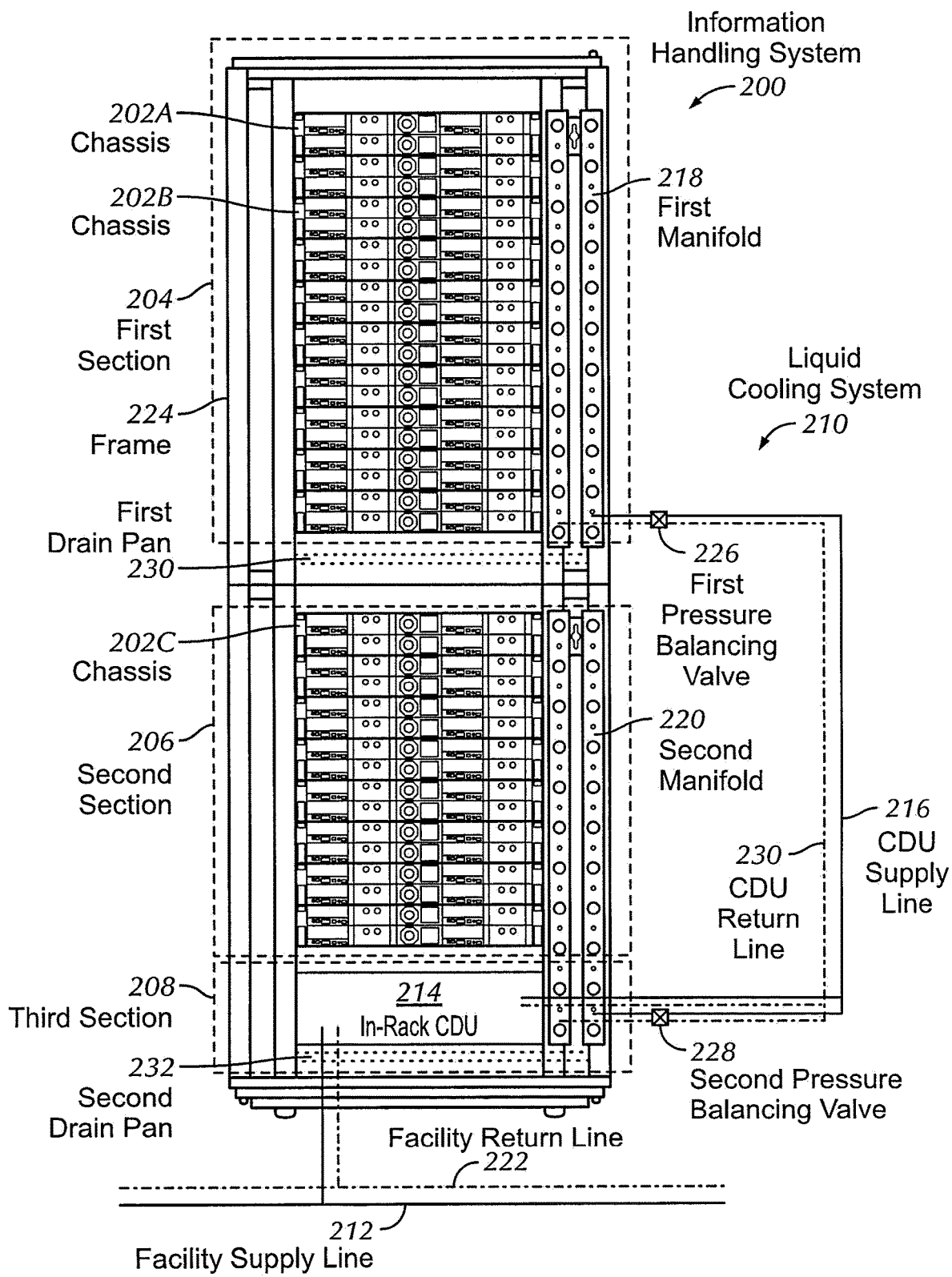
FIG. 2.1

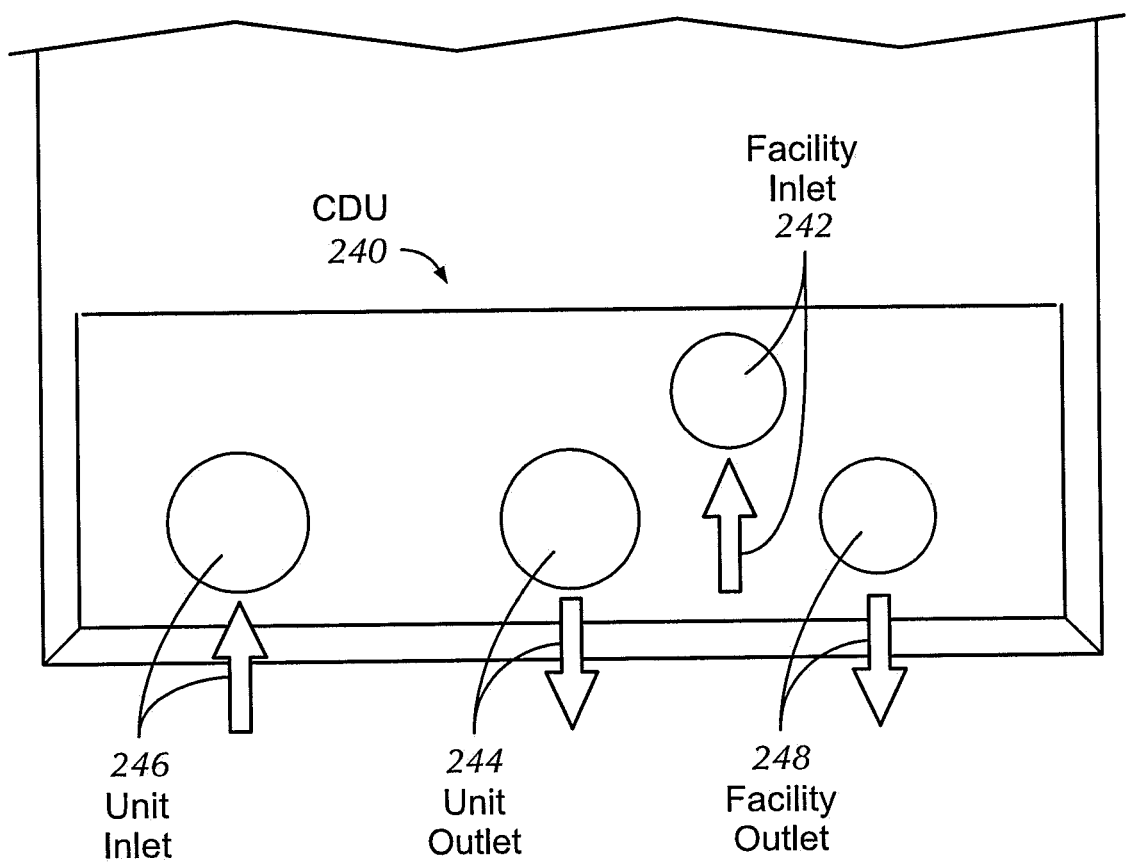
FIG. 2.2

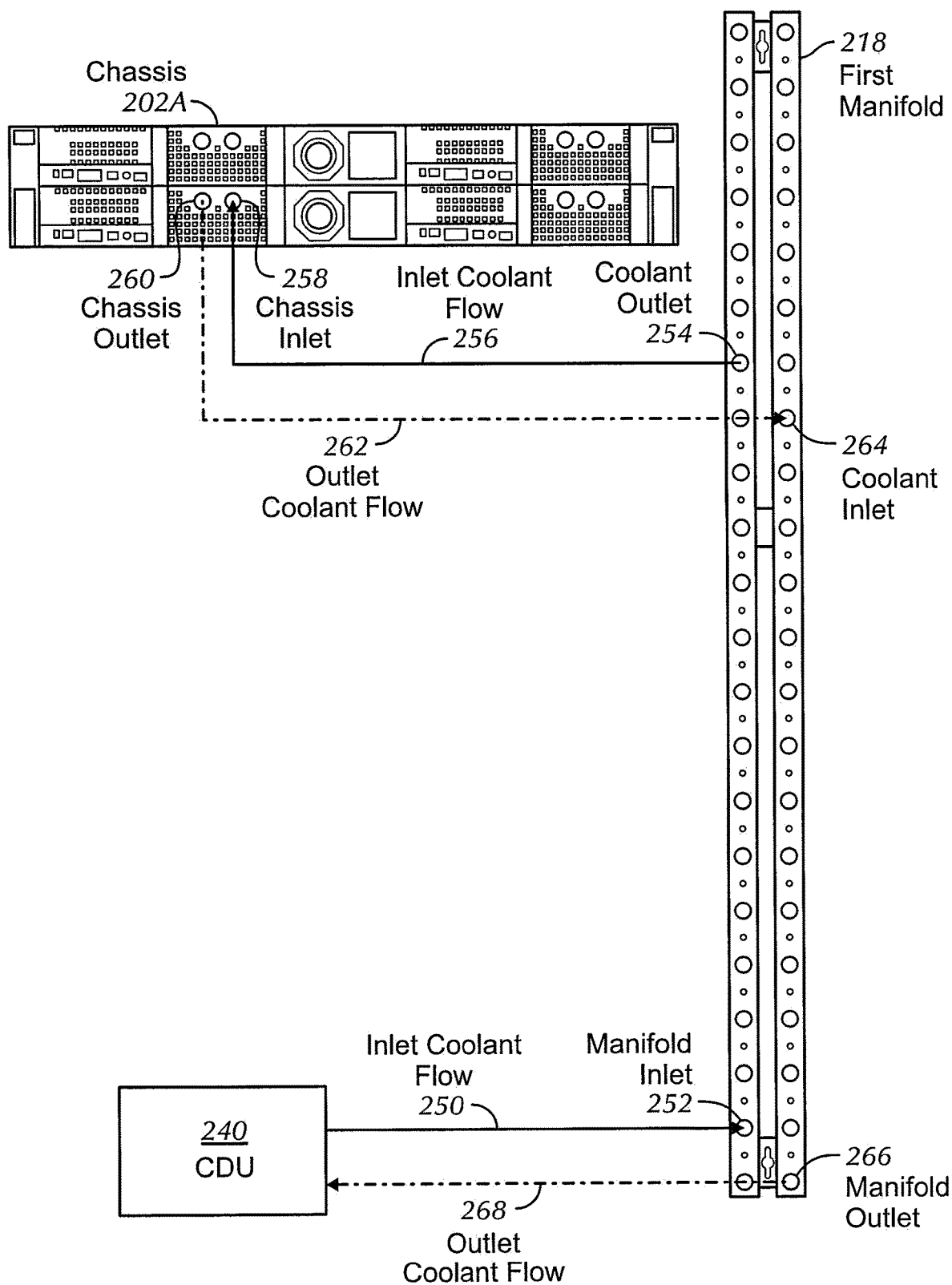
FIG. 2.3

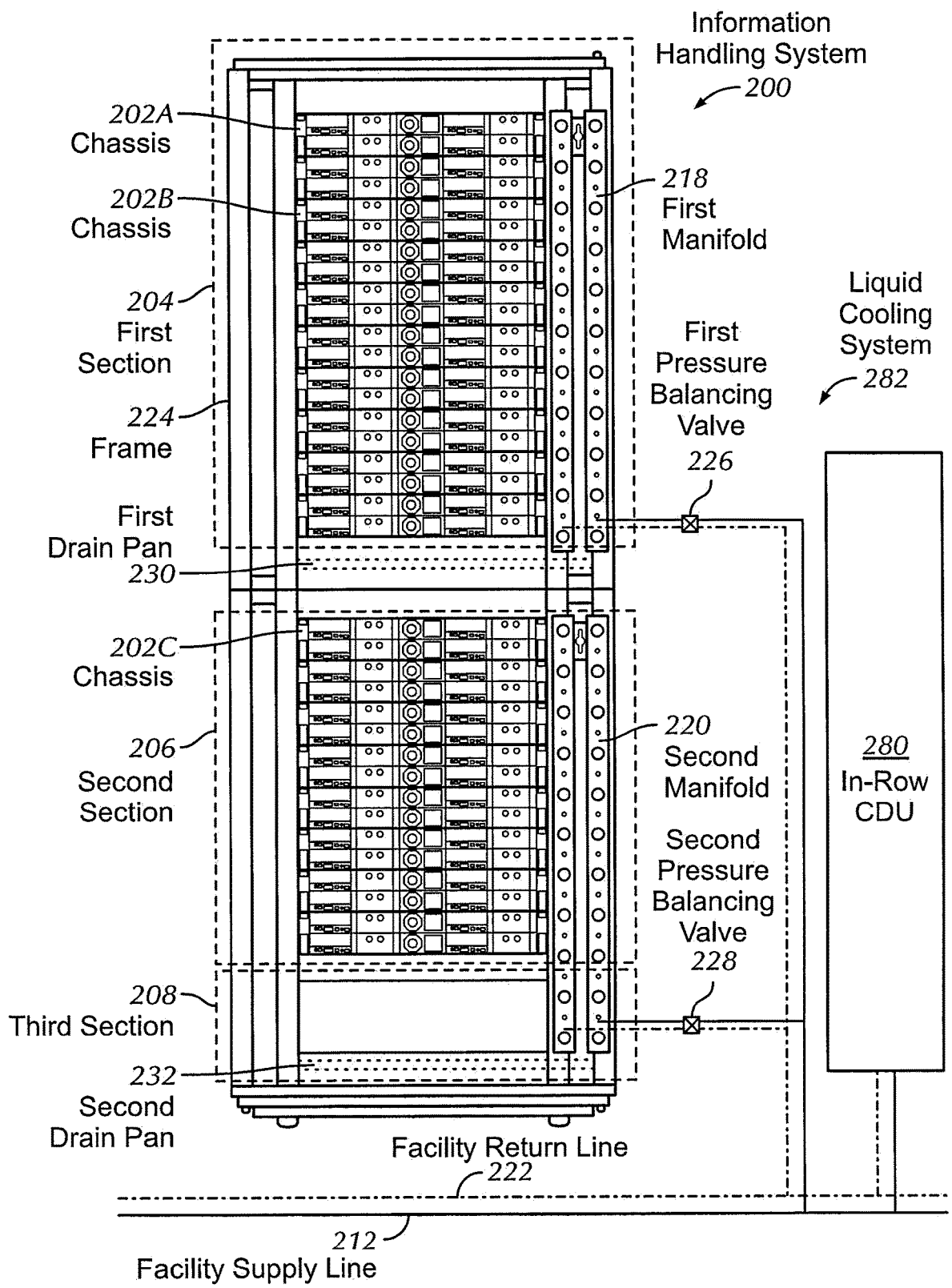
*FIG. 2.4*

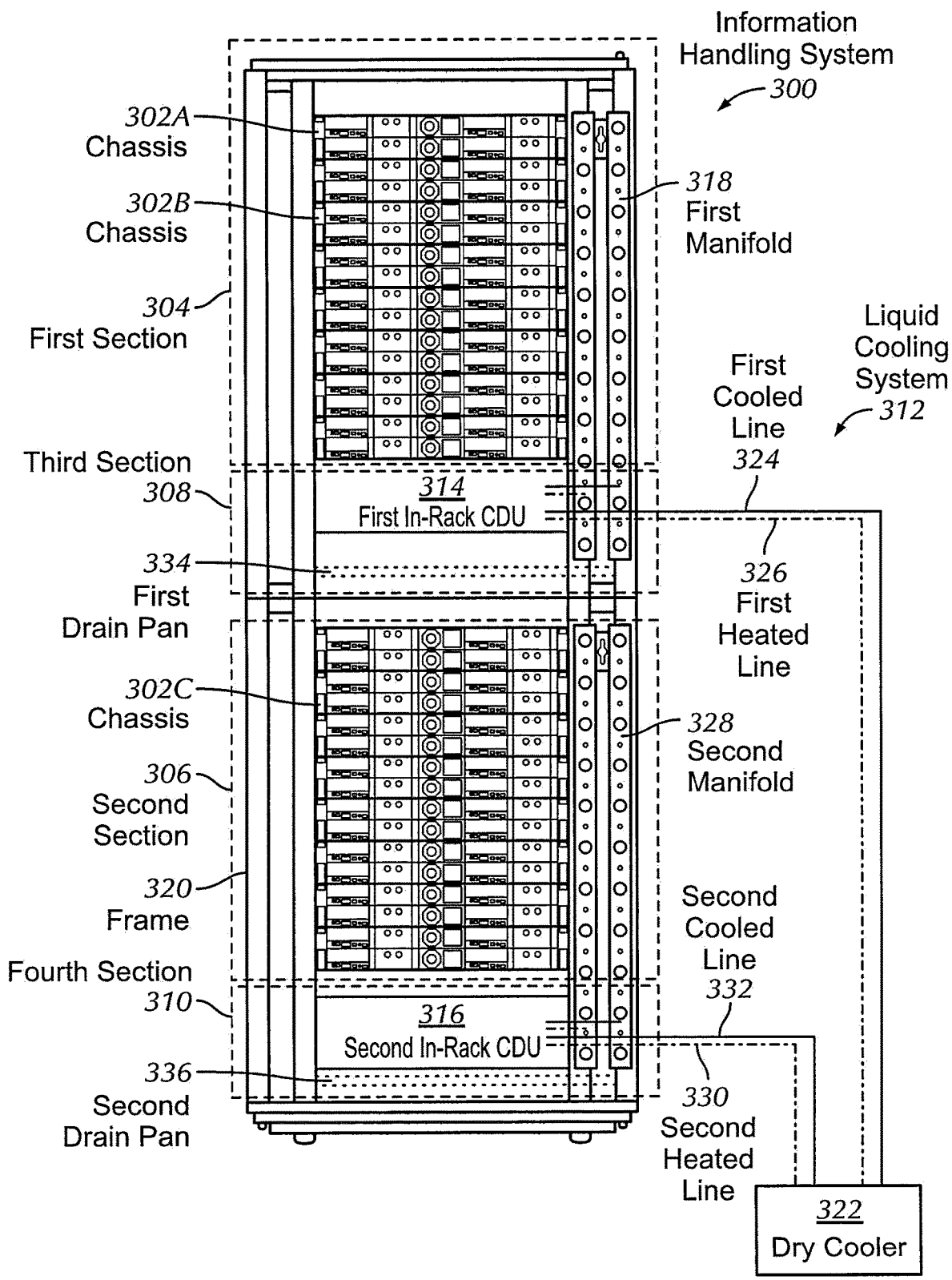
*FIG. 3.1*

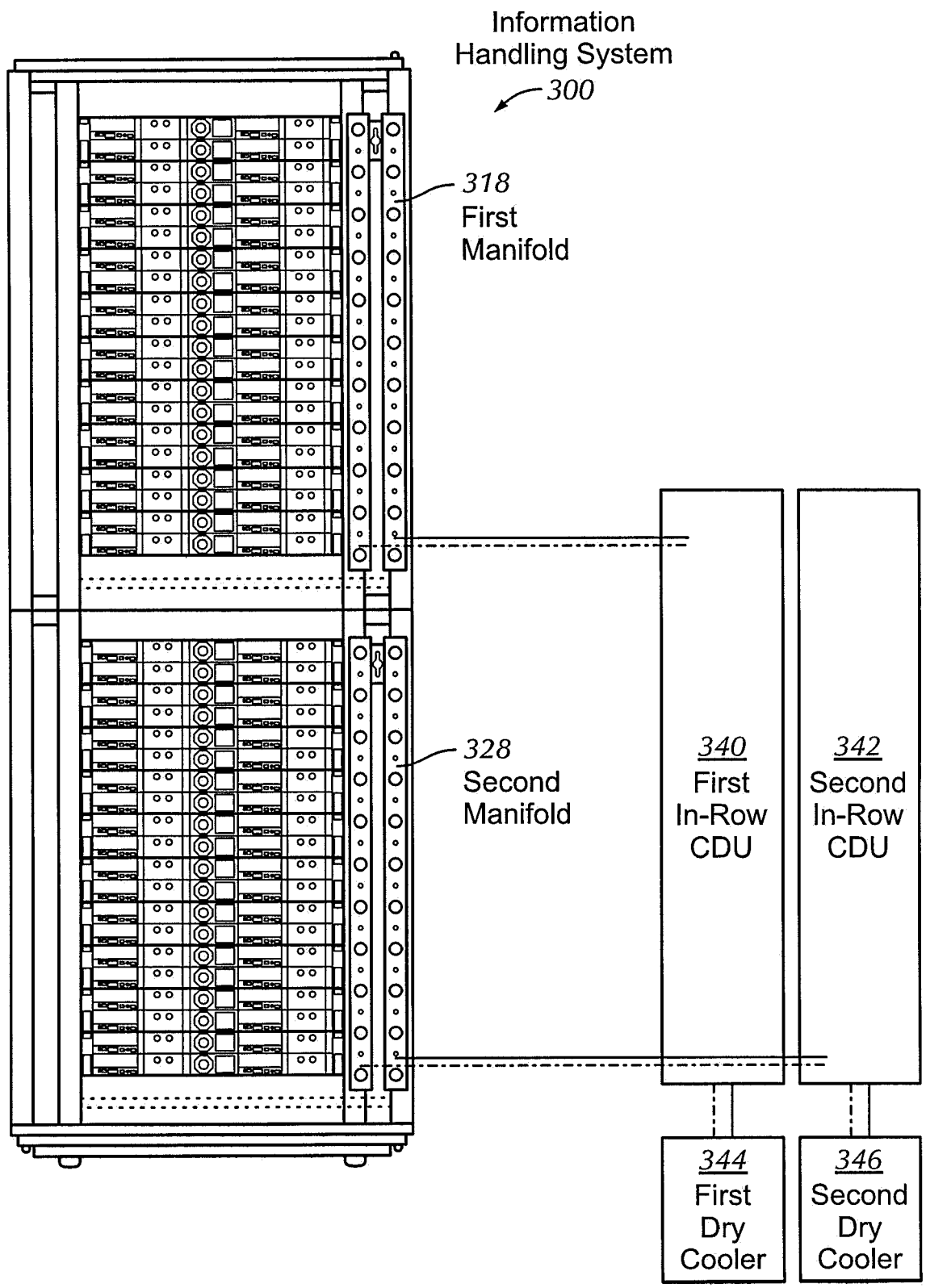
*FIG. 3.2*

SYSTEM AND METHOD FOR PER-TENANT REDUNDANT THERMAL MANAGEMENT USING LIQUID COOLING

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack two or more chassis in an information handling system. Due to the changing uses of information handling systems, chassis therein may be modular allowing for continual partial upgrades to the information handling system. That is, an information handling system may be composed of multiple chassis that may be attached to each other to form the information handling systems. When the multiple chassis are attached, components of the information handling system disposed in each of the chassis may become operably connected to each other.

SUMMARY

In general, in one aspect, the invention relates to a system comprising a first section comprising a first plurality of chassis associated with a first tenant, a second section comprising a second plurality of chassis associated with a second tenant, a first pair of cooling units, a first pair of manifolds fluidly connecting the first plurality of chassis to the first pair of cooling units, a second pair of cooling units, and a second pair of manifolds fluidly connecting the first plurality of chassis to the first pair of cooling units.

Other aspects of the invention will be apparent from the following description and the appended claims.

BRIEF DESCRIPTION OF DRAWINGS

FIG. 1.1 shows a diagram of an information handling system in accordance with one or more embodiments of the invention.

FIG. 1.2 shows a diagram of a building that includes information handling systems in accordance with one or more embodiments of the invention.

FIG. 2.1 shows a front view of an information handling systems in accordance with one or more embodiments of the invention.

FIG. 2.2 shows a back view of a coolant distribution unit in accordance with one or more embodiments of the invention.

FIG. 2.3 shows a diagram of a cooling system in accordance with one or more embodiments of the invention.

FIG. 2.4 shows a diagram of an information handling system in accordance with one or more embodiments of the invention.

FIG. 3.1 shows a diagram of an information handling system in accordance with one or more embodiments of the invention.

FIG. 3.2 shows a diagram of an information handling system in accordance with one or more embodiments of the invention.

DETAILED DESCRIPTION

Figure 4:
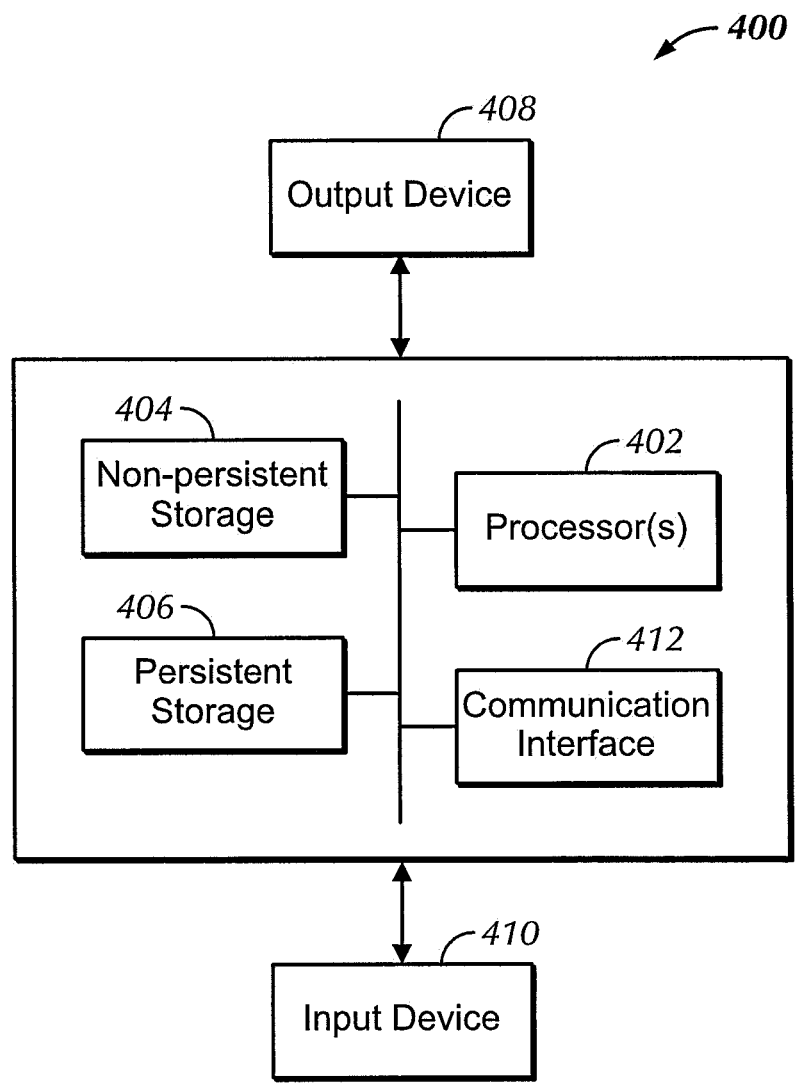
FIG. 4 shows a diagram of a computing device in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for thermally managing components of an information handling system. An information handling system may be a system that provides computer implemented services. These services may include, for example, database services, electronic communication services, data storage services, etc.

To provide these services, the information handling system may include one or more computing devices. The computing devices may include any number of computing components that facilitate the providing of the services of the information handling system. The computing components may include, for example, processors, memory modules, circuit cards that interconnect these components, etc.

During operation, these components may generate heat and require fluid flows to maintain the temperatures of these components within nominal ranges. Further, the information handling system may include multiple sections, with each section including one or more computing devices and/or chassis. Each section may receive a different rate of fluid flow. The rate of fluid flow may be based on a number of factors, including thermal need, component specifications, financial considerations, etc.

Embodiments of the invention may provide methods and systems that thermally manage the information handling system on a sectional basis. To provide thermal management on a sectional basis, embodiments of the invention may include manifolds for each section of the information handling system. Further, embodiments of the invention may also include other cooling components for each section of the information handling system. For example, each section may include a separate manifold, fluid lines, coolant distribution units, valves, or any other object used to provide fluid cooling to an information handling system.

By doing so, a system in accordance with embodiments of the invention may be less likely to prematurely fail, be able to provide separate cooling systems to separate sections of an information handling system, enable multiple users (also referred to as tenants) to use a single information handling system, reduce the service intervals for the cooling system, and/or provide enhanced separation between sections of an information handling system.

Further, embodiments of the invention relate to providing both isolation of chassis on a per-tenant basis and further providing redundant cooling units on a per-tenant basis. In these embodiments, each tenant is ensured isolation of its chassis and is also ensured isolated and redundant cooling units. Thus, even if there are multiple tenants in a given rack, the operation (or failure) of chassis or cooling units of one tenant does not impact the operation of another tenant. Further, by having redundant cooling units for each tenant, a given tenant may continue to operate even though one of its cooling units becomes inactive (or otherwise fails). Additional detail related to the per-tenant redundant cooling units is provided in FIGS. 5-10 below.

FIG. 1.1 shows an information handling system (10) in accordance with one or more embodiments of the invention. The system may include a frame (110) and any number of chassis (e.g., 100A, 100B, 100C).

As will be discussed in greater detail below, the information handling system (10) may include any number of cooling components. A cooling component may be a device that may be used to thermally condition fluid flows used to thermally management components of the information handling system. The cooling components provide fluid flows at a chassis level to provide liquid cooling for components within the chassis.

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis (e.g., direct airflows to the chassis). By managing the chassis, the frame (110) may enable multiple chassis to be densely packed in space without negatively impacting the operation of the information handling system (10).

The frame may include a door (112) to selectively provide access to an interior portion of the information handling system (10). Further, multiple doors (112) may be utilized, with each door (112) selectively providing access to different sections of the information handling system (10). For example, different users may be provided access to different sections of the information handling system (10), which may enable the information handling system (10) to serve multiple users.

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include fluid exchanges. A fluid exchange may be one or more openings in an exterior of a chassis that enables the chassis to exchange fluid (e.g., liquid coolant) with a cooling system. For example, a chassis may utilize a fluid inlet to receive a fluid flow, then pass through the fluid flow through one or more internal heat exchangers to remove heat from one or more components contained within the chassis. The chassis may then utilize a fluid outlet to expel the now heated fluid flow to a cooling system configured to receive the fluid flow from the chassis. Consequently, the temperatures of components within the chassis may be reduced by utilizing the cooler fluid taken into the chassis via a fluid exchange.

To further clarify the environments in which IHSs may reside, a diagram of an environment in which chassis of IHSs may reside is illustrated in FIG. 1.2.

Turning to FIG. 1.2, FIG. 1.2 shows a top view diagram of a building (115) in which chassis of IHSs may reside in accordance with one or more embodiments of the invention. The building (115) may house a data center (e.g., an aggregation of information handling systems) that includes any number of information handling systems (e.g., 10A, 10B). The information handling systems may include chassis, which may need to take in and expel fluids for temperature regulation purposes due to heat generation by components disposed in the chassis.

To facilitate fluid management within the building (115), the information handling systems may be organized into rows (or other groupings of information handling systems). In FIG. 1.2, the rows of information handling systems extend from top to bottom along the page. To enable gases to be provided to the information handling systems (e.g., for temperature regulation purposes), a fluid conduit (120) may be disposed within the building. The fluid conduit (120) may provide supply fluid flows (122) and take in return fluid flows (124). These fluid flows are illustrated as arrows having dashed tails.

The supply fluid flows (122) may be at a lower temperature than the return fluid flows (124). Consequently, when information handling systems obtain portions of the supply fluid flows (122), the information handling systems may be able to utilize the supply fluid flows (122) to cool components disposed within the chassis of the information handling systems. For example, fluid from the supply fluid flows (122) may be passed by components disposed within chassis of information handling systems that are at elevated temperatures. The fluids may be at a lower temperature than the components. Consequently, thermal exchange between the fluids and the components may decrease the temperature of the components.

After utilizing the gases from the supply fluid flows (122), the information handling systems may expel the fluids as the return fluid flows (124). After being expelled from the information handling systems, the return fluid flows (124) may be obtained by the fluid conduit (120), cooled, and recirculated as the supply fluid flows (122).

To manage the aforementioned process, a system environmental manager (130) may be disposed within the building (115) or at other locations. The system environmental manager (130) may be a computing device programmed to (i) obtain information regarding the operation of the information handling systems and (ii) set the operating points of the fluid conduit (120). By doing so, the system environmental manager (130) may cause the fluid conduit (120) to provide fluids to the information handling systems having a temperature level that may better enable the information handling systems to regulate their respective environmental conditions within the chassis of the respective information handling systems. However, conditioning the supply fluid flows (122) may utilize large amounts of energy.

Cooling the return fluid flows (124) may be costly, consume large amounts of electricity, or may otherwise be undesirable. To reduce these costs, the system environmental manager (130) may set the operating point (e.g., desired temperature levels of different portions of the supply fluid flows (122)) of the fluid conduit (120) to only provide the minimum necessary characteristics required by each of the IHSs so that it meets is service life goals. By doing so, the cost of providing the supply fluid flows (122) having characteristics required to meet the environmental requirements of the chassis of the information handling systems may be reduced.

To decide how to set the operating points of the airflow conditioner (120), the system environmental manager (130) may obtain and/or be provided information regarding the environmental conditions (e.g., temperatures) within each of the chassis. For example, the system environmental manager (130) may be operably connected to environmental managers of each of the chassis and/or the fluid conduit (120) via any combination of wired and/or wireless networks. The respective environmental managers of the chassis may provide such information to the system environmental manager (130) and/or service requests regarding the operating points of the fluid conduit (120) via the operable connections.

In one or more embodiments of the invention, the system environmental manager (130) is implemented using computing devices. The computing devices may be, for example, mobile phones, tablet computers, laptop computers, desktop computers, servers, distributed computing systems, embedded computing devices, or a cloud resource. The computing devices may include one or more processors, memory (e.g., random access memory), and persistent storage (e.g., disk drives, solid state drives, etc.). The persistent storage may store computer instructions, e.g., computer code, that (when executed by the processor(s) of the computing device) cause the computing device to provide the functionality of the system environmental manager (130). The system environmental manager (130) may be implemented using other types of computing devices without departing from the invention. For additional details regarding computing devices, refer to FIG. 4.

In one or more embodiments of the invention, the system environmental manager (130) may be implemented using a hardware device including circuitry. The system environmental manager (130) may be implemented using, for example, a digital signal processor, a field programmable gate array, or an application specific integrated circuit. The system environmental manager (130) may be implemented using other types of hardware devices without departing from the invention.

In one or more embodiments of the invention, the system environmental manager (130) is implemented using computing code stored on a persistent storage that when executed by a processor performs all, or a portion, of the functionality of the system environmental manager (130). The processor may be a hardware processor including circuitry such as, for example, a central processing unit or a microcontroller. The processor may be other types of hardware devices for processing digital information without departing from the invention.

In one or more embodiments of the invention, the system environmental manager (130) is implemented using distributed computing devices. As used herein, a distributed computing device refers to functionality provided by a logical device that utilizes the computing resources of one or more separate and/or distinct computing devices. For example, in one or more embodiments of the invention, the system environmental manager (130) is implemented using distributed devices that include components distributed across any number of separate and/or distinct computing devices. In such a scenario, the functionality of the system environmental manager (130) may be performed by multiple, different computing devices without departing from the invention.

Turning to FIG. 2.1, FIG. 2.1 shows a diagram of an information handling system (200) in accordance with one or more embodiments of the invention. The IHS (200) may include multiple chassis (e.g., 202A, 202B, 202C) disposed in different sections of the IHS (200). For example, the IHS (200) includes multiple sections. A first section (204) may include multiple chassis and a second section (206) may also include multiple chassis. Further, a third section (208) includes a portion of a liquid cooling system (210). The IHS may include more or fewer sections and each section may contain any number of suitable chassis and/or cooling components of the liquid cooling system (210) without departing from the invention.

As discussed above, the chassis may include computing devices that generate heat during operation. If left unchecked, a buildup of heat within a chassis may cause temperatures of the components disposed within the chassis to exceed preferred ranges. The liquid cooling system (210) is provided to remove heat from the chassis.

To do so, the liquid cooling system (210) includes a facility supply line (212) that provides a flow of cooled liquid (e.g., water, non-conductive fluid, or any other liquid suitable for cooling components in an IHS) to the IHS (200). The facility supply line (212) is fluidly coupled to an in-rack coolant distribution unit (CDU) (214) that provides flow control for the liquid cooling system (210).

The in-rack CDU (214) may include controllers and/or computing devices to control flow characteristics, temperature, and/or pressure of fluid flowing through the in-rack CDU (214). Further, the in-rack CDU (214) may include a form factor such that it can fit in a space designed to fit a chassis. In one embodiment, the in-rack CDU (214) is positioned in a section separate from the chassis. Further, the in-rack CDU (214) may provide coolant distribution to more than one section of the IHS. The in-rack CDU (214) provides cooling to the first section (204) and the second section (206). The in-rack CDU (214) may provide cooling to more than two sections and/or more than one IHS without departing from the invention.

Continuing with the discussion of fluid flows, the liquid exits the in-rack CDU (214) and flows into a CDU supply line (216). The CDU supply line (216) splits the flow received from the in-rack CDU (214) and provides a first fluid flow to a first manifold (218) and a second fluid flow to a second manifold (220). Each of the manifolds is configured to receive a fluid flow from the CDU supply line (216) and split that flow amongst the chassis fluidly coupled to the respective manifolds.

To do so, each manifold is mechanically coupled to a frame (224) of the IHS (200). The mechanical coupling between the frame (224) and the manifold provides structural support for the manifold while also positioning the inlets and outlets in a location convenient for fluid coupling. Each manifold includes outlets configured to supply fluid flows to the chassis and inlets configured to receive fluid flows from the chassis. For example, the manifolds may include one outlet and one inlet for each chassis. The fluid then flows out of a manifold at a coolant outlet and into chassis inlet. From there, the fluid passes through the chassis and exchanges heat with one or more components within the chassis to remove heat from the chassis. For a more detailed discussion of the fluid flows between the manifolds and the chassis, see FIG. 2.3 below.

Next, the fluid flows out of the chassis through a chassis outlet, and returns to the manifold, entering the manifold through a coolant inlet. The fluid then flows through the manifold and exits the manifold through a manifold outlet. The fluid flows out of the manifold and enters a CDU return line (230) and into the in-rack CDU (214) through a unit inlet. The fluid may then be processed (i.e., cooled) by the in-rack CDU (214) and returned to the CDU supply line (216), or the fluid may flow out of the in-rack CDU (216) and flow into the facility return line (222) to be processed elsewhere.

In one embodiment, each section of the IHS (200) that includes chassis includes a separate manifold. By doing so, separation and/or resiliency of the cooling system (210) may be achieved. For example, a user who has access to the first section (204) but not the second section (206) can access the first manifold (218) but not the second manifold (220). In this manner, the user can access the portion of the liquid cooling system (210) that supplies the first section (204) with a fluid flow. Thus, the user may provide connections between the first manifold (218) and the chassis contained within the first section (204). Further, the user may be able to customize the fluid flows to their personal needs. For example, a first chassis may a single inlet and outlet for fluid flows, a second chassis may include multiple inlets and outlets for fluid flows, and a third chassis may not include any inlets or outlets for fluid flows.

Further, flows to each of the first section (204) and the second section (206) may be restricted. The restrictions may be based on a number of factors, including thermal need, component specifications, financial considerations, etc. To achieve the restrictions, a first pressure-balancing valve (226) is included between the in-rack CDU (214) and the first manifold (218) and a second pressure-balancing valve (228) is included between the in-rack CDU (214) and the second manifold (220). The pressure-balancing valves restrict the pressure flowing through them to a set pressure that defines a maximum pressure of fluid flowing through the pressure-balancing valve. Because the cross-sectional area of the CDU supply line (216) is a known quantity, the pressure-balancing valves may be used to restrict flows to a particular maximum flow rate. By using the pressure-balancing valves, a single in-rack CDU (214) can provide fluid flows having different pressures and/or flow rates at different manifolds. Further, the pressure-balancing valves may include a passive device that may be manually configured to a set pressure, or an active device that may be adjusted using a controller.

The liquid cooling system (210) may also include a first drain pan (230) for the first section (204) and a second drain pan (232) for the second section (206). Each of the drain pans may include a container to receive any leaks that may form in the liquid cooling system (210), thus containing the leak to a controlled area and preventing a leak from affecting areas below the drain pan. As such, the drain pans are located at a bottom portion of their respective sections. Further, the drain pans may include sensors capable of detecting a presence of a leak and may also include a computing device capable of receiving data indicative of a leak and providing an alert that a leak has occurred. For additional details regarding computing devices, refer to FIG. 4.

Turning to FIG. 2.2, FIG. 2.2 shows a diagram of a backside of a CDU (240) which may include the in-rack CDU (214) of FIG. 2.1. As discussed above, the CDU (240) may exchange fluid flows with manifold coupled to an IHS and with a facility. To do so, the CDU (240) include a facility inlet (242) which is fluidly coupled to a facility supply line and allows fluid to flow into the CDU (240). The fluid is then processed by the CDU (240) and exits the CDU (240) at the unit outlet (242) where fluid then flows to a manifold, as discussed above. Then, the fluid flows back from a manifold and enters the CDU (240) at a unit inlet (246). Then, the CDU (240) may reprocess the fluid and send it back through the unit outlet and/or send the fluid out of the facility outlet (248) to a facility return line to enable the fluid to be processed at some other location.

Turning to FIG. 2.3, FIG. 2.3 shows the fluid couplings between a CDU (240), a first manifold (218), and a chassis (202A). As discussed above, the CDU (240) provides a coolant flow to the chassis (202A) via the first manifold (218). To do so, fluid flows out from the CDU (240), through the inlet coolant flow (250), and into the manifold inlet (252) of the first manifold (218). The fluid then flows through the first manifold (218) and is distributed to the chassis fluidly coupled to the first manifold (218). For illustrative purposes, only one chassis (202A) is shown coupled to the first manifold (218); however, any number of chassis may be fluidly coupled to the first manifold (218).

To distribute the fluid to the chassis (202A), the fluid flows out of the first manifold (218) through a coolant outlet (254) and into an inlet coolant flow (256). The fluid then flows into the chassis (202A) through a chassis inlet (258). The fluid then exchanges heat with one or more components within the chassis (202A) and exits the chassis (202A) through the chassis outlet (260). Then, the fluid flows through the outlet coolant flow (262) to return to the first manifold (218) through a coolant inlet (264) of the first manifold (218). The fluid then flows through the first manifold (218) where it may join other flows returning from other chassis. The fluid then flows out of the first manifold (218) through a manifold outlet (266), through an outlet coolant flow (268) and back into the CDU (240). As discussed above, the CDU (240) may then process the fluid and send it back through the inlet coolant flow (250), or the CDU (240) may send the fluid to a facility return line so that the fluid may be processed elsewhere.

Turning to FIG. 2.4, FIG. 2.4 shows a diagram of the information handling system (200) with an in-row CDU (280). As discussed above, the chassis may include computing devices that generate heat during operation.

To do so, the liquid cooling system (282) includes a facility supply line (212) that provides a flow of cooled liquid (e.g., water, non-conductive fluid, or any other liquid suitable for cooling components in an IHS) to the IHS (200). The facility supply line (212) is fluidly coupled to an in-row CDU (280) that provides flow control for the liquid cooling system (282).

The in-row CDU (280) may include controllers and/or computing devices to control flow characteristics, temperature, and/or pressure of fluid flowing through the in-row CDU (280). Further, the in-row CDU (280) may include a form factor such that it can fit within a frame (224) of an IHS; however, the in-row CDU (280) differs from an in-rack CDU in that the in-row CDU does not fit within the same frame as the chassis for which it provides a coolant flow. Further, in some embodiments, the in-row CDU (280) is freestanding. Further, the in-row CDU (280) may provide coolant distribution to more than one section of the IHS. The in-row CDU (280) provides cooling to the first section (204) and the second section (206). The in-row CDU (280) may provide cooling to more than two sections and/or more than one IHS without departing from the invention.

Continuing with the discussion of fluid flows, the liquid exits the in-row CDU (280) and flows into a CDU supply line (not shown). The CDU supply line splits the flow received from the in-row CDU (280) and provides a first fluid flow to a first manifold (218), and a second fluid flow to a second manifold (220). Each of the manifolds is configured to receive a fluid flow from the CDU supply line and split that flow amongst the chassis fluidly coupled to the respective manifolds.

To do so, each manifold is mechanically coupled to the frame (224) of the IHS (200). The mechanical coupling between the frame (224) and the manifold provides structural support for the manifold while also positioning the inlets and outlets in a location convenient for fluid coupling.

Each manifold includes outlets configured to supply fluid flows to the chassis and inlets configured to receive fluid flows from the chassis. For example, the manifolds may include one outlet and one inlet for each chassis. The fluid then flows out of a manifold at a coolant outlet and into chassis inlet. From there, the fluid passes through the chassis and exchanges heat with one or more components within the chassis to remove heat from the chassis.

Next, the fluid flows out of the chassis through a chassis outlet, and returns to the manifold, entering the manifold through a coolant inlet. The fluid then flows through the manifold and exits the manifold through a manifold outlet. The fluid flows out of the manifold and enters a CDU return line and into the in-row CDU (280) through a unit inlet. The fluid may then be processed (i.e., cooled) by the in-row CDU (280) and returned to the CDU supply line, or the fluid may flow out of the in-row CDU (280) and flow into the facility return line (222) to be processed elsewhere.

In one embodiment, each section of the IHS (200) that includes chassis includes a separate manifold. By doing so, separation and/or resiliency of the cooling system (210) may be achieved. For example, a user who has access to the first section (204) but not the second section (206) can access the first manifold (218) but not the second manifold (220). In this manner, the user can access the portion of the liquid cooling system (210) that supplies the first section (204) with a fluid flow. Thus, the user may provide connections between the first manifold (218) and the chassis contained within the first section (204). Further, the user may be able to customize the fluid flows to their personal needs. For example, a first chassis may include a single inlet and outlet for fluid flows, a second chassis may include multiple inlets and outlets for fluid flows, and a third chassis may not include any inlets or outlets for fluid flows.

Further, flows to each of the first section (204) and the second section (206) may be restricted. The restrictions may be based on a number of factors, including thermal need, component specifications, financial considerations, etc. To achieve the restrictions, a first pressure-balancing valve (226) is included between the in-row CDU (280) and the first manifold (218) and a second pressure-balancing valve (228) is included between the in-row CDU (280) and the second manifold (220). The pressure-balancing valves restrict the pressure flowing through them to a set pressure that defines a maximum pressure of fluid flowing through the pressure-balancing valve. The pressure-balancing valves may be used to restrict flows to a particular maximum flow rate. By using the pressure-balancing valves, a single in-row CDU (280) can provide fluid flows that have different pressures and/or flow rates at different manifolds. Further, the pressure-balancing valves may include a passive device that may be manually configured to a set pressure, or an active device that may be adjusted using a controller.

The liquid cooling system (282) may also include a first drain pan (230) for the first section (204) and a second drain pan (232) for the second section (206). Each of the drain pans may include a container to receive any leaks that may form in the liquid cooling system (282), thus containing the leak to a controlled area and preventing a leak from affecting areas below the drain pan. As such, the drain pans are located at a bottom portion of their respective sections. Further, the drain pans may include sensors capable of detecting a presence of a leak and may also include a computing device capable of receiving data indicative of a leak, as well as providing an alert that a leak has occurred. For additional details regarding computing devices, refer to FIG. 4.

Turning to FIG. 3.1, FIG. 3.1 shows a diagram of an information handling system (300) with each section having a separate in-rack CDU. The IHS (300) may include multiple chassis (e.g., 302A, 302B, 302C) disposed in different sections of the IHS (300). For example, the IHS (300) includes multiple sections. A first section (304) may include multiple chassis and a second section (306) may also include multiple chassis. Further, a third section (308) and a fourth section (310) each includes a portion of a liquid cooling system (312). The IHS may include more or fewer sections, and each section may contain any number of suitable chassis and/or cooling components of the liquid cooling system (312) without departing from the invention.

As discussed above, the chassis may include computing devices that generate heat during operation. If left unchecked, a buildup of heat within a chassis may cause temperatures of the components disposed within the chassis to exceed preferred ranges. The liquid cooling system (312) is provided to remove heat from the chassis.

To do so, the liquid cooling system (312) provides a flow of cooled liquid (e.g., water, non-conductive fluid, or any other liquid suitable for cooling components in an IHS) to the IHS (300). A facility supply line is fluidly coupled to both a first in-rack CDU (314) and a second in-rack CDU (316) with each CDU providing flow control for the liquid cooling system (312).

The first in-rack CDU (314) and the second in-rack CDU (316) may each include controllers and/or computing devices to control flow characteristics, temperature, and/or pressure of fluid flowing through the respective in-rack CDU. Further, each of the first in-rack CDU (314) and the second in-rack CDU (316) may include a form factor such that it can fit in a space designed to fit a chassis. In one embodiment, the in-rack CDU is positioned in a section separate from the chassis. In the present embodiment, each in-rack CDU provides a coolant flow to a single section. In this manner, the use of the CDU is not shared between separate sections.

Continuing with the discussion of fluid flows for the first section (304), the liquid exits the first in-rack CDU (314) and flows into a CDU supply line and into the first manifold (318). The first manifold is configured to receive a fluid flow from the CDU supply line and split that flow amongst the chassis fluidly coupled to the first manifold (318).

To do so, the first manifold (318) is mechanically coupled to a frame (320) of the IHS (300). The mechanical coupling between the frame (320) and a manifold provides structural support for the manifold while also positioning the inlets and outlets in a location convenient for fluid coupling. The first manifold (318) includes outlets configured to supply fluid flows to the chassis and inlets configured to receive fluid flows from the chassis. For example, the first manifold (318) may include one outlet and one inlet for each chassis. The fluid then flows out of the first manifold (318) at a coolant outlet and into a chassis inlet. From there, the fluid passes through the chassis and exchanges heat with one or more components within the chassis to remove heat from the chassis. The fluid coupling between the first manifold (318) and the chassis may be the same as those found in FIG. 2.3.

Next, the fluid flows out of the chassis through a chassis outlet, and returns to the first manifold (318), entering the first manifold (318) through a coolant inlet. The fluid then flows through the first manifold (318) and exits the first manifold (318) through a manifold outlet. The fluid flows out of the first manifold (318) and enters a CDU return line and into the first in-rack CDU (314) through a unit inlet. The fluid may then be processed (i.e., cooled) by the in-rack CDU (314) and returned to the first manifold (318), or the fluid may flow out of the first in-rack CDU (314) and flow into a dry cooler (322) via a first heated line (324) where the fluid may be cooled and returned to the first in-rack CDU (314) via the first heated line (326). The dry cooler (e.g., 322) is a heat transfer device that uses air to remove heat (or excess heat) from the fluid being cooled; however, there is no direct contact between the air and the fluid being cooled.

Fluid flows for the second section (306) may follow similar paths using the second in-rack CDU (316) instead of the first in-rack (314), the second manifold (328) instead of the first manifold (318), the second heated line (330) instead of the first heated line (326), and the second cooled line (332) instead of the first cooled line (324). In one embodiment, the dry cooler (322) is fluidly coupled to the first in-rack CDU (314) and the second in-rack CDU (316). Some embodiments may include a separate dry cooler and/or multiple dry coolers for each CDU without departing from the invention.

In one embodiment, each section of the IHS (300) that includes chassis includes a separate manifold. By doing so, separation and/or resiliency of the cooling system (312) may be achieved. For example, a user who has access to the first section (304) but not the second section (306) can access the first manifold (318) but not the second manifold (328). In this manner, the user can access the portion of the liquid cooling system (312) that supplies the first section (304) with a fluid flow. Thus, the user may provide connections between the first manifold (318) and the chassis contained within the first section (304). Further, the user may be able to customize the fluid flows to their personal needs. For example, a first chassis may include a single inlet and outlet for fluid flows, a second chassis may include multiple inlets and outlets for fluid flows, and a third chassis may not include any inlets or outlets for fluid flows.

Further, flows to each of the first section (304) and the second section (306) may be restricted. The restrictions may be based on a number of factors, including thermal need, component specifications, financial considerations, etc. To achieve the restrictions, each the first in-rack CDU (314) and the second in-rack CDU (316) may include hardware to selectively set a limit on the amount of coolant supplied to their respective sections. For example, the limit may be based on pressure, thermal capacity, and/or flow rates.

The liquid cooling system (312) may also include a first drain pan (334) for the first section (304), and a second drain pan (336) for the second section (306). Each of the drain pans may include a container to receive any leaks that may form in the liquid cooling system (312), thus containing the leak to a controlled area and preventing a leak from affecting areas below the drain pan. As such, the drain pans are located at a bottom portion of their respective sections. Further, the drain pans may include sensors capable of detecting a presence of a leak and may also include a computing device capable of receiving data indicative of a leak, and providing an alert that a leak has occurred. For additional details regarding computing devices, refer to FIG. 4.

Turning now to FIG. 3.2, FIG. 3.2 shows a diagram of the information handling system (300) with each section having a separate in-row CDU. The IHS (300) is substantially the same as the IHS (300) shown in FIG. 3.1. In the present embodiment, the CDUs provided are in-row CDUs. For example, a first in-row CDU (340) provides coolant flow to the first manifold (318) and a second in-row CDU (342) provides coolant flow to the second manifold (328). The coolant flow returning from the first manifold (318) to the first in-row CDU (340) may then be cooled by the first dry cooler (344) and returned to the first in-row CDU (340). The coolant flow returning from the second manifold (328) to the second in-row CDU (342) may then be cooled by the second dry cooler (346) and returned to the second in-row CDU (342). Further, the first dry cooler (344) and the second dry cooler (346) may each include one or more dry coolers or they may be the same dry cooler.

Embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) (402) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

FIGS. 2.1-3.2 show embodiments directed to per-tenant cooling units (e.g., in-rack CDUs, in-row CDUs, etc.). The following description and FIGS. 5-10 describe embodiments in which there are redundant cooling units (i.e., two or more) associated with each tenant in a multi-tenant rack. In one or more embodiments, each tenant may be associated with a pair (or more) of cooling units. Further, chassis associated with each tenant may be fluidly connected to the pair (or more) of cooling units using manifolds, where the manifolds may be in a horizontal or vertical orientation in the rack.

In another embodiment, the cooling units may be mounted in a rack—also referred to as a cooling rack—where the rack only includes cooling units. In this embodiment, the chassis for the different tenants may be mount in other racks, where these other racks include at least one set of manifolds per tenant. The cooling units in the cooling racks may then be fluidly connected to the chassis in the other racks via the manifolds.

In one or more embodiments, the chassis for each tenant may be physically separated from other chassis of other tenants such that each tenant only has access to their own chassis. In certain embodiments, the cooling units for a given tenant may only be accessible to the tenant (see e.g., FIG. 5) while in other embodiments the cooling units may only be accessible to the data center personnel (see e.g., FIG. 7). In this manner, each tenant may be able to access its own chassis and, in certain embodiments, its own cooling units within a rack (or system).

The following figures show various exemplary configurations of cooling units, chassis, and manifolds; however, these configurations are not intended to limit the scope of the invention. In addition, for simplicity, various details and/or components are not shown and/or are not described in FIGS. 5-10; however, these components are described and/or are shown in FIGS. 1-4. Further, FIGS. 5-10 show example configurations for two tenants; however, embodiments of the invention may be extended to any number of tenants without departing from the invention.

Figure 5:
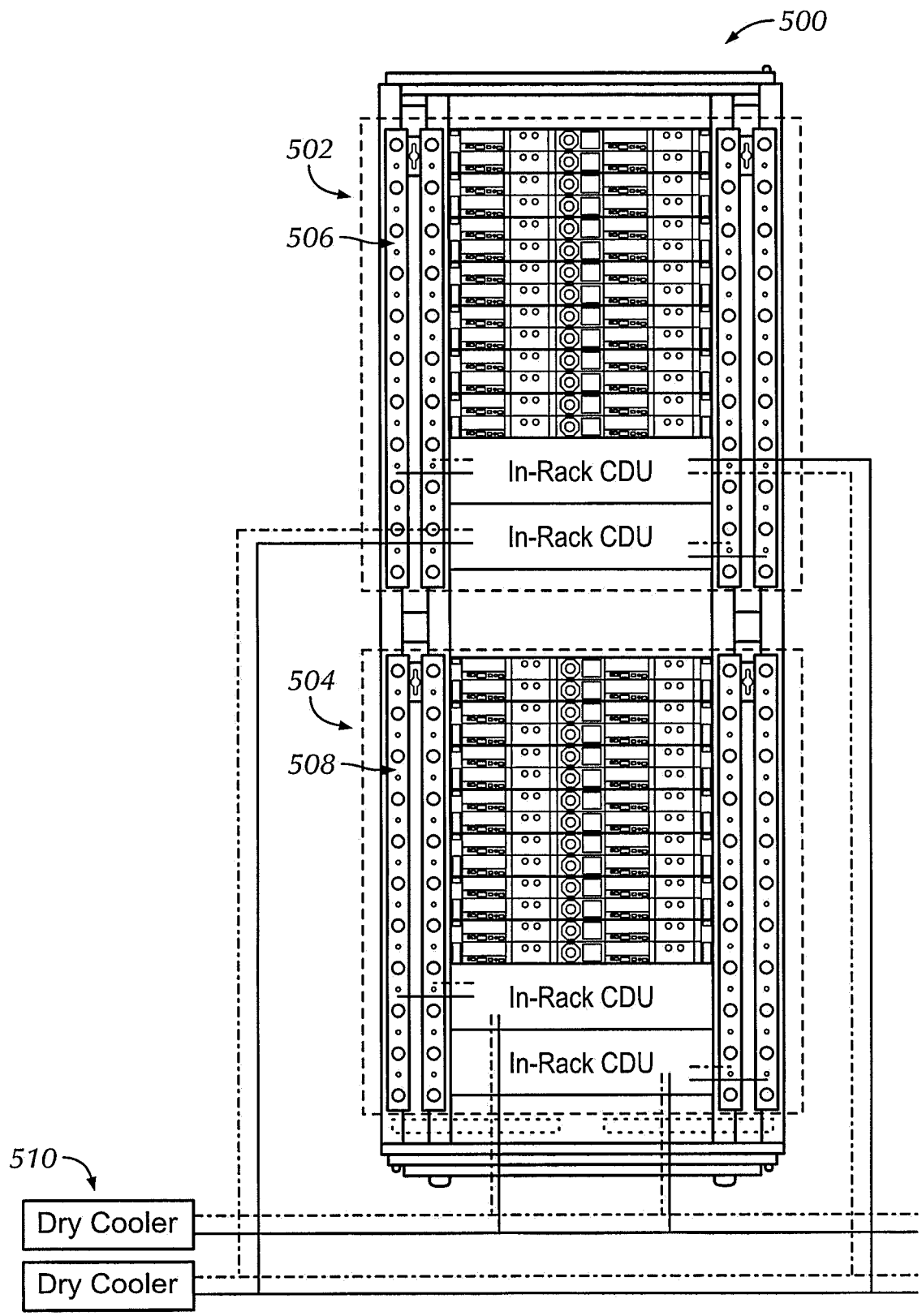
FIG. 5 shows a diagram of a system in accordance with one or more embodiments of the invention.

FIG. 5 shows a diagram of a system in accordance with one or more embodiments of the invention. The system includes a rack (500) that includes a first section (502) with chassis and a pair of in-rack CDUs for a first tenant and second section (504) with chassis and a pair of in-rack CDUs for a second tenant. The vertically-orientated manifolds (506) for the first tenant are located in the first section (502) and the vertically-orientated manifolds (508) for the second section (508) are located in the second section (508). In this example, the in-rack CDUs for the tenant are deemed to be co-located with the chassis for the tenant. Finally, the in-rack CDUs in the first and second sections each are fluidly connected to facility supply and facility return lines (510). Said another way, the in-rack CDUs in the first section (502) are fluidly connected to a pair of facility supply and facility return lines and the in-rack CDUs in the second section (504) are fluidly connected to their own distinct pair of facility supply and facility return lines.

Figure 6:
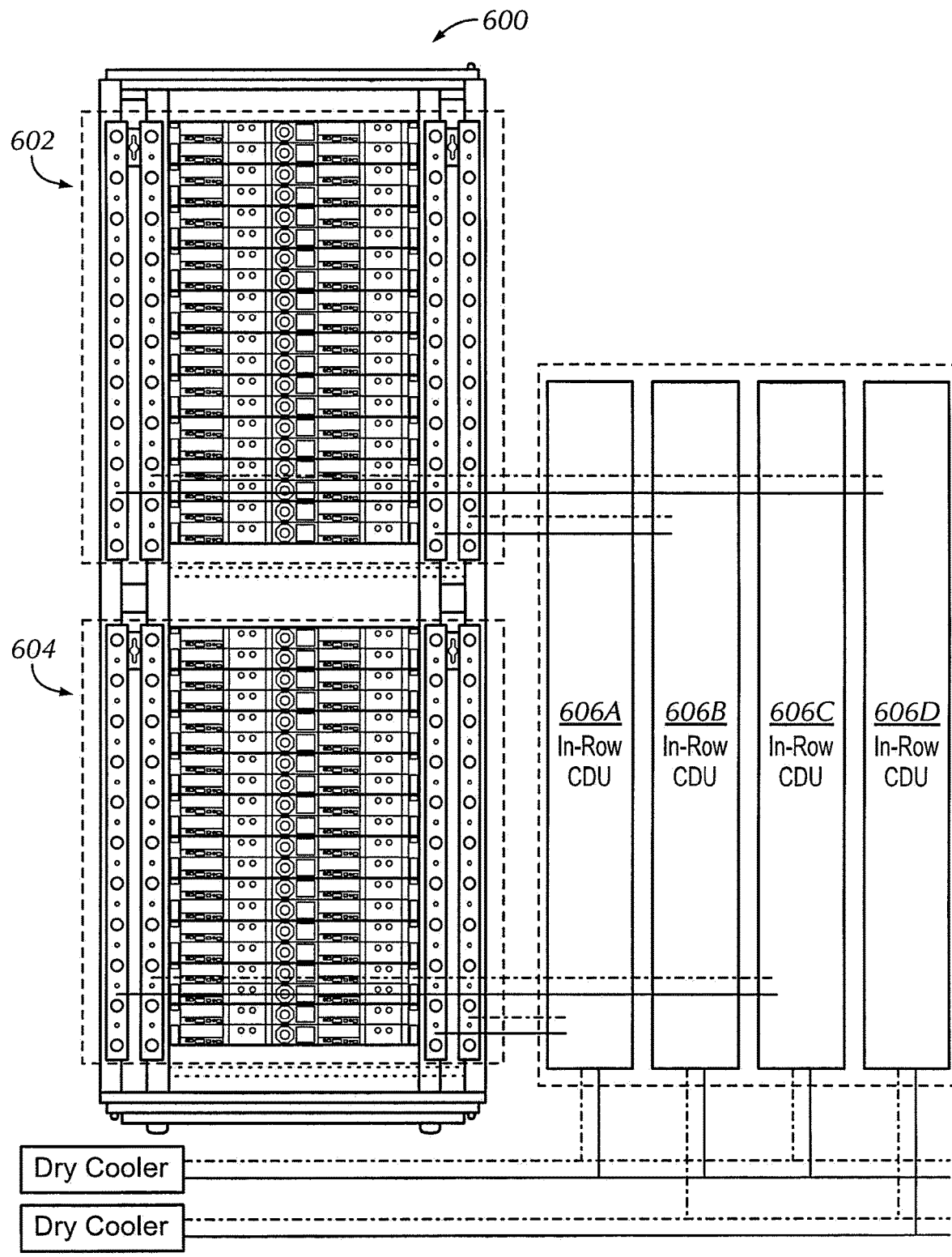
FIG. 6 shows a diagram of a system in accordance with one or more embodiments of the invention.

FIG. 6 shows a diagram of a system in accordance with one or more embodiments of the invention. The system includes a rack (600) that is substantially similar to the rack shown in FIG. 5, except that the chassis in the first section (602) are cooled by a first set of in-row CDUs (606B, 606D) and the chassis in the second section (604) are cooled by the second set of in-row CDUs (606A, 606C).

Figure 7:
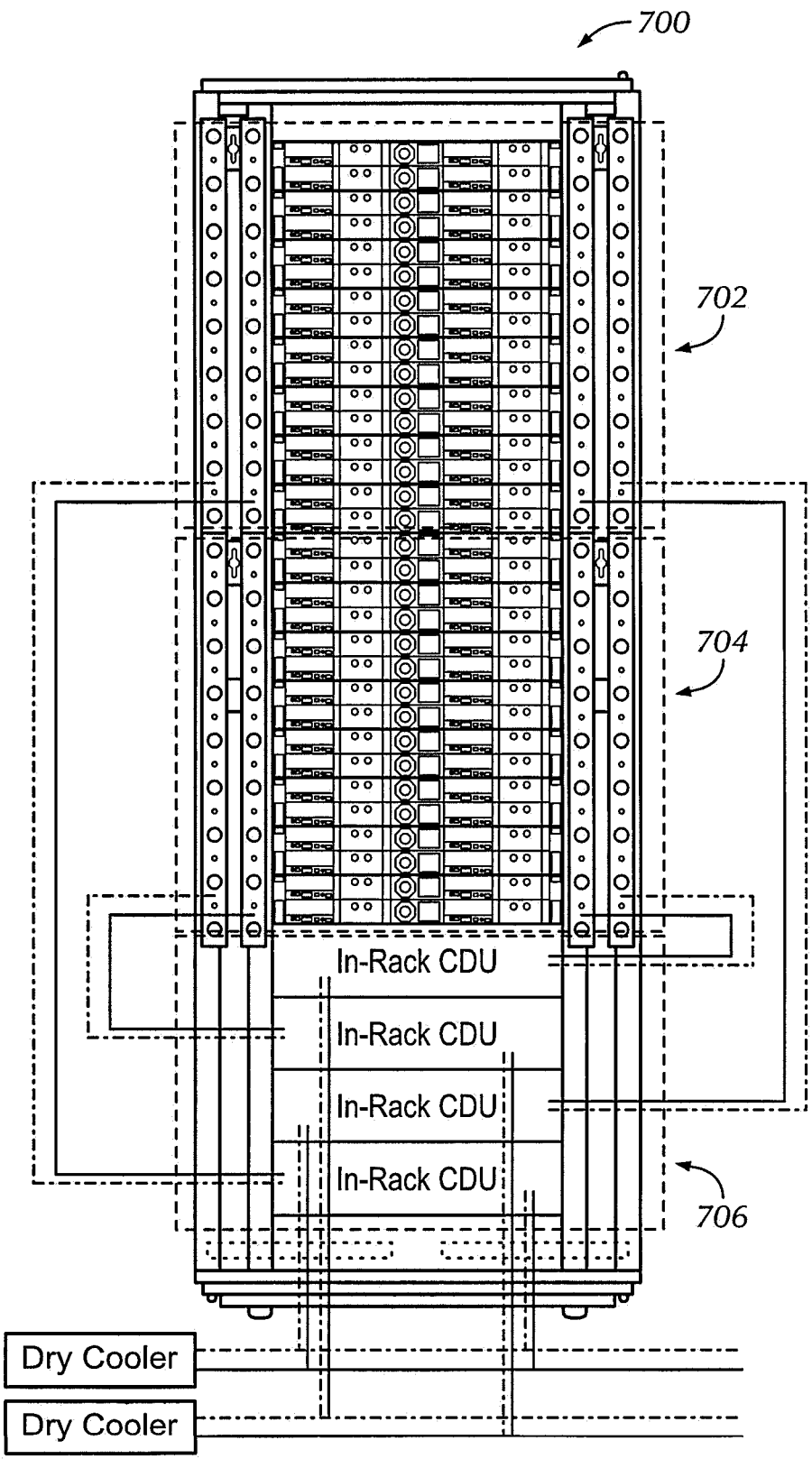
FIG. 7 shows a diagram of a system in accordance with one or more embodiments of the invention.

FIG. 7 shows a diagram of a system in accordance with one or more embodiments of the invention. The system includes a rack (700) that is substantially similar to the rack shown in FIG. 5, except that the chassis in the first section (702) are cooled by a first set of in-rack CDUs in a third section (706) and the chassis in the second section (704) are cooled by the second set of in-rack CDUs in the third section (706). In this embodiment, neither tenant may access the third section; rather, the third section may only be accessed by data center personnel. Access may be restricted, for example, by have a locking door (or panel) that prevents unauthorized access to the third section (706).

Figure 8:
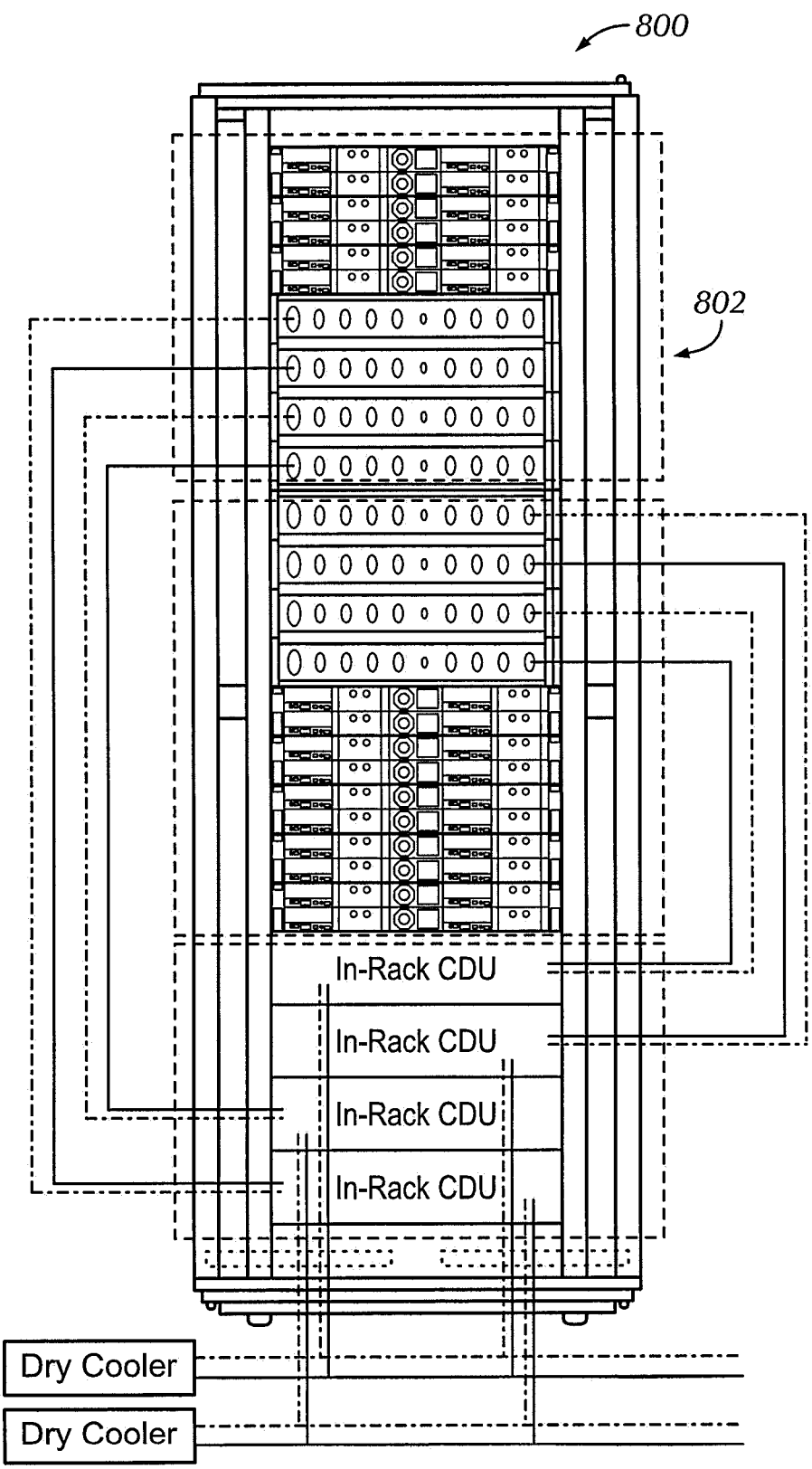
FIG. 8 shows a diagram of a system in accordance with one or more embodiments of the invention.

FIG. 8 shows a diagram of a system in accordance with one or more embodiments of the invention. The system includes a rack (800) that is substantially similar to the rack shown in FIG. 7, except that the manifolds (802) in the rack are oriented horizontally.

Figure 9:
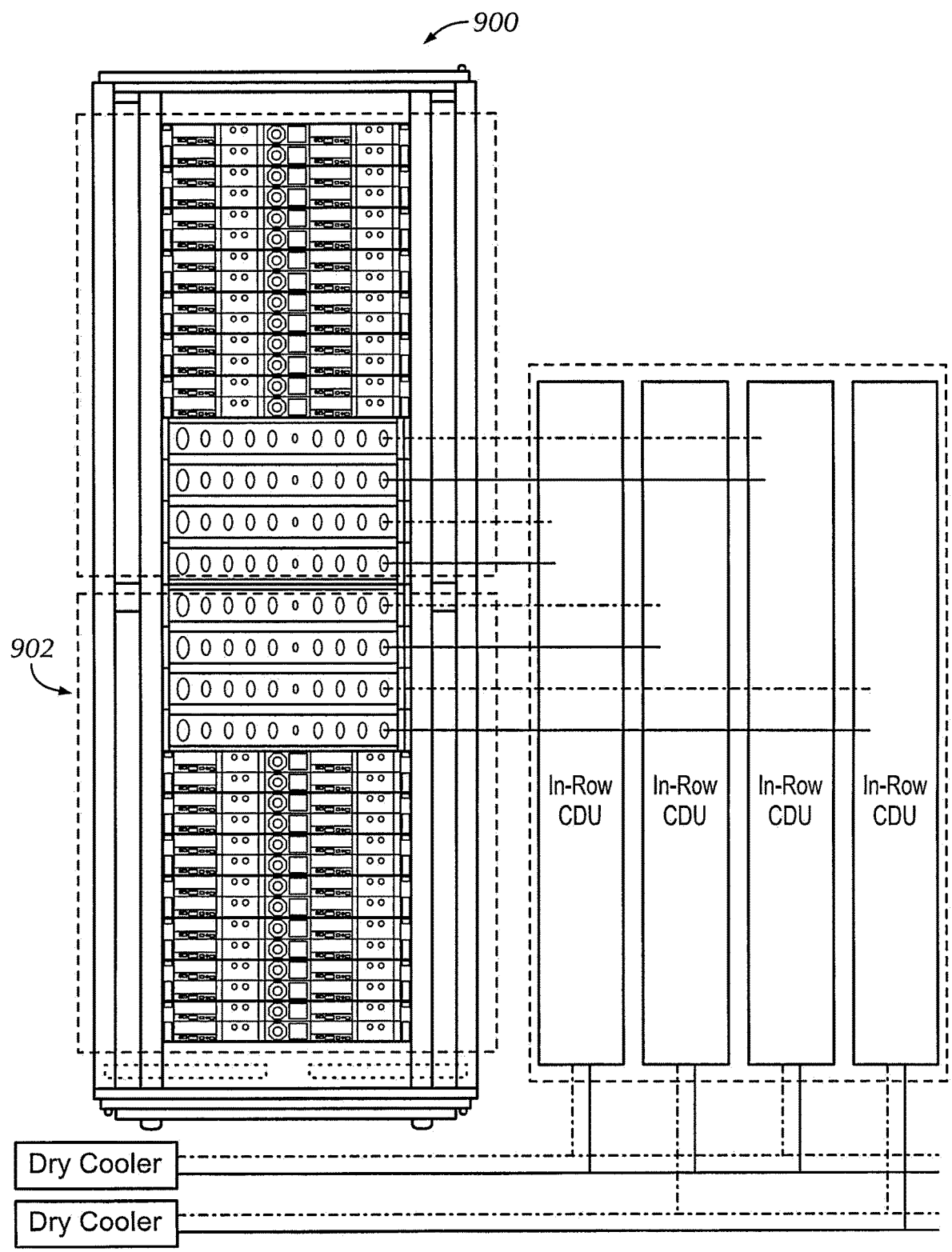
FIG. 9 show a diagram of a system in accordance with one or more embodiments of the invention.

FIG. 9 show a diagram of a system in accordance with one or more embodiments of the invention. The system includes a rack (900) that is substantially similar to the rack shown in FIG. 6, except that the manifolds (902) in the rack are oriented horizontally.

Figure 10:
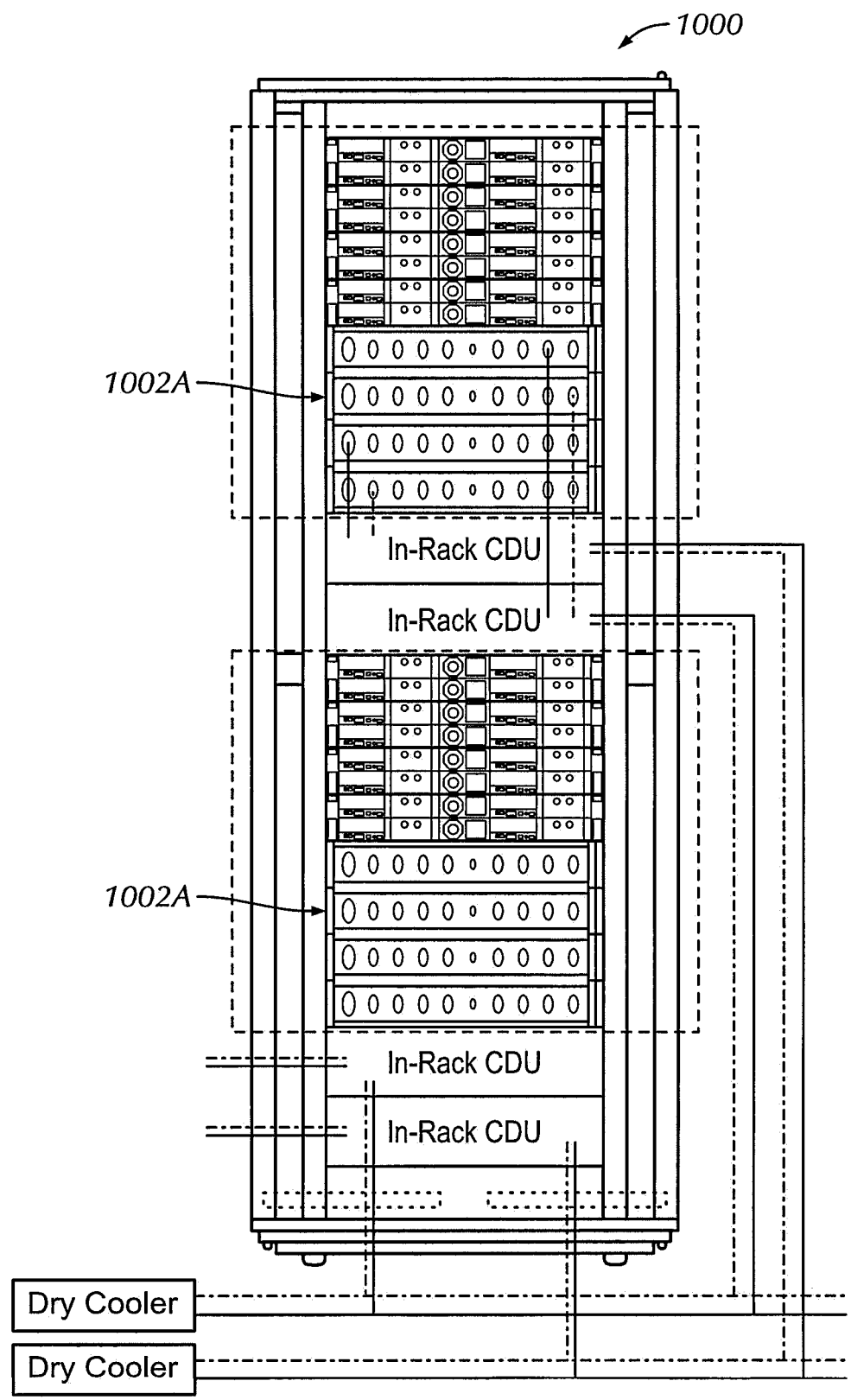
FIG. 10 shows a diagram of a system in accordance with one or more embodiments of the invention.

FIG. 10 shows a diagram of a system in accordance with one or more embodiments of the invention. The system includes a rack (1000) that is substantially similar to the rack shown in FIG. 5, except that the manifolds (1002A, 1002B) in the rack are oriented horizontally.

Embodiments of the invention may provide an improved method for thermally managing components of an information handling system on a sectional basis. To provide thermal management on a sectional basis, embodiments of the invention may include manifolds for each section of the information handling system. Further, embodiments of the invention may also include other cooling components for each section of the information handling system. For example, each section may include a separate manifold, fluid lines, coolant distribution units, valves, or any other object used to provide fluid cooling to an information handling system. Further, embodiments provide a redundant cooling units for each tenant in the rack; thereby providing further resiliency for the operation of the data center.

Thus, embodiments of the invention may address the problem of different sections of an information handling system having different thermal management needs and/or different economic considerations for the amount of coolant provided. Specifically, embodiments of the invention may provide a system of providing varying fluid flows to different sections of an information handling system.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the computing device (400). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A system comprising:
    a rack comprising:
        a first section comprising a first plurality of chassis associated with a first tenant;
        a second section comprising a second plurality of chassis associated with a second tenant, wherein the first section is physically separated from the second section;
        a first pair of cooling units comprising a second cooling unit and a fourth cooling unit;
        a first pair of manifolds fluidly connecting the first plurality of chassis to the first pair of cooling units;
        a second pair of cooling units comprising a first cooling unit and a third cooling unit;
        a second pair of manifolds fluidly connecting the second plurality of chassis to the second pair of cooling units; and
        wherein the first cooling unit, the second cooling unit, the third cooling unit, and the fourth cooling unit are arranged sequentially in a row.

2. The system of claim 1, wherein the first pair of cooling units are in-row cooling distribution units.

3. The system of claim 2, wherein the first section and the second section are in the rack and the in-row cooling distribution units are external to the rack.

* * * * *